US011079066B2

(12) United States Patent
Roe

(10) Patent No.: US 11,079,066 B2
(45) Date of Patent: Aug. 3, 2021

(54) FIBER OPTIC SAFETY SYSTEM

(71) Applicant: Philippe Roe, Lenoir, NC (US)

(72) Inventor: Philippe Roe, Lenoir, NC (US)

( * ) Notice: Subject to any disclaimer, the term of this patent is extended or adjusted under 35 U.S.C. 154(b) by 192 days.

(21) Appl. No.: 16/344,442

(22) PCT Filed: Oct. 30, 2017

(86) PCT No.: PCT/US2017/059089
§ 371 (c)(1),
(2) Date: Apr. 24, 2019

(87) PCT Pub. No.: WO2018/081736
PCT Pub. Date: May 3, 2018

(65) Prior Publication Data
US 2019/0323658 A1   Oct. 24, 2019

Related U.S. Application Data

(60) Provisional application No. 62/414,705, filed on Oct. 29, 2016, provisional application No. 62/572,441, filed on Oct. 14, 2017.

(51) Int. Cl.
F16P 3/12        (2006.01)
F16P 3/08        (2006.01)
G01D 5/353       (2006.01)
G02B 6/04        (2006.01)
H03K 17/94       (2006.01)

(52) U.S. Cl.
CPC .......... F16P 3/12 (2013.01); F16P 3/08 (2013.01); G01D 5/35341 (2013.01); G02B 6/04 (2013.01); H03K 17/943 (2013.01); H03K 2217/94111 (2013.01); H03K 2217/94112 (2013.01)

(58) Field of Classification Search
CPC .......... F16P 3/12; F16P 3/08; G01D 5/35341; G02B 6/04; H03K 17/943; H03K 2217/94111; H03K 2217/94112
USPC .................................................... 250/227.14
See application file for complete search history.

(56) References Cited

U.S. PATENT DOCUMENTS

| 4,437,728 A | 3/1984 | Ohashi |
| 4,774,407 A | 9/1988 | Erbe |
| 4,830,461 A | 5/1989 | Ishiharada et al. |
| 4,898,445 A | 2/1990 | Newell et al. |
| 4,982,107 A | 1/1991 | Fayfield |
| 5,026,984 A | 6/1991 | Gerdt |

(Continued)

Primary Examiner — Tomi Skibinski
(74) Attorney, Agent, or Firm — Daniel P. Burke & Associates, PLLC; Daniel P. Burke; Georgia Damoulakis

(57) ABSTRACT

Safety systems for operating equipment have a source of visible light, a first signal light transmitter, a first signal light receiver, preferably a second signal light transmitter and second signal light receiver. A fiber optic bundle with at least one section of illuminated cable emits the visible light and carries the signal light. The signal light follows an optical circuit through the fiber optic bundle from the signal light transmitters to the signal light receivers. The signal light receivers are connected to suitable controls of the system such that if a predetermined light signal is not received by the signal light receiver(s), the operating equipment will stop and/or alarms will be generated. The fiber optic bundle is connected to optical pull switches which interrupt the light circuit if a person applies a predetermined pull force to the optical fiber bundle.

17 Claims, 14 Drawing Sheets

(56) References Cited

U.S. PATENT DOCUMENTS

| | | |
|---|---|---|
| 5,087,838 A | 2/1992 | Fayfield |
| 5,198,664 A | 3/1993 | Fayfield |
| 5,222,165 A | 6/1993 | Bohlinger |
| 5,254,846 A | 10/1993 | Fayfield |
| 5,266,793 A | 11/1993 | Smith |
| 5,454,056 A | 9/1995 | Brothers |
| 5,572,075 A * | 11/1996 | Campbell ............... F16P 3/08 192/129 A |
| 5,698,828 A | 12/1997 | Perkins |
| 5,721,794 A | 2/1998 | Uchiyama et al. |
| 5,777,557 A | 7/1998 | Fayfield |
| 5,808,296 A | 9/1998 | McMonagle |
| D412,316 S | 7/1999 | Fayfield |
| 5,923,427 A | 7/1999 | Dong |
| 5,930,417 A | 7/1999 | Wolfe et al. |
| 6,302,565 B1 | 10/2001 | Nuzzio |
| 6,492,821 B1 | 12/2002 | Marko et al. |
| D471,162 S | 3/2003 | Fayfield |
| 6,546,344 B1 | 4/2003 | Rodrian et al. |
| 6,549,058 B1 | 4/2003 | Bondarev |
| 6,593,755 B1 | 7/2003 | Rosengren |
| 6,946,643 B1 | 9/2005 | Fayfield |
| D527,404 S | 8/2006 | Brickzin |
| 7,095,893 B2 | 8/2006 | Reiners |
| 7,329,854 B2 | 2/2008 | Clifton et al. |
| D563,444 S | 3/2008 | Brickzin |
| 7,368,704 B2 | 5/2008 | Dean et al. |
| 7,379,013 B2 | 5/2008 | Dean et al. |
| 7,492,276 B2 | 2/2009 | Fayfield |
| 7,612,707 B2 | 11/2009 | Wise et al. |
| D616,481 S | 5/2010 | Wampler |
| D700,149 S | 2/2014 | Carlson et al. |
| D748,506 S | 2/2016 | Stecker et al. |
| 2003/0068118 A1 | 4/2003 | Bourgeois et al. |
| 2003/0215172 A1 | 11/2003 | Koenig |
| 2004/0136642 A1 | 7/2004 | Wilson |
| 2005/0047707 A1 | 3/2005 | Goememann |
| 2005/0145802 A1 | 7/2005 | MacKinnon |
| 2006/0072251 A1 * | 4/2006 | Ross ....................... G05B 9/02 361/1 |
| 2015/0254949 A1 | 9/2015 | Knight et al. |

\* cited by examiner

FIBER OPTIC SAFETY SYSTEM

RELATED APPLICATION DATA

This application claims the benefit of U.S. Provisional Patent Application No. 62/414,705 filed on Oct. 29, 2016, and U.S. Provisional Patent Application No. 62/572,441 filed on Oct. 14, 2017.

Safety systems for dangerous, enclosed structures which typically involve human ingress and ingress, provide a trapped person with ability to stop a dangerous operation and escape or be rescued. Safety systems also provide a manner of stopping dangerous equipment when mounted externally on the equipment or in close proximity to the equipment. The safety systems utilize an illuminated pull cable connected to a fiber optic safety switch. A trapped person has a chance to see and pull the illuminated pull cable in order to terminate an operation which would create a danger to him. The safety systems are particularly useful in large autoclaves, rack wash equipment, grain silos, explosive environments such as oxygen storage tanks, and other confined spaces which typically involve human ingress/egress. The disclosed switches stop the operating cycle of the environment, and/or send alarms, e.g. audible, visible and/or electronic alarms.

BACKGROUND

Lives have been lost due to people accidently getting trapped inside dangerous enclosures. For example, accidents involving large autoclaves have claimed the lives of workers when the autoclave was closed and operation of the cleaning cycle was commenced while a technician was still inside. Operating equipment and structures having confined spaces which present unsurvivable operating conditions to a trapped person are sometimes located in noisy environments where calls for help by a trapped person may not be heard. Such structures also can have multiple doors for human ingress and egress so that a technician may erroneously assume that a co-worker has exited through a different door than they had entered.

FIGS. 1(a)-(e) illustrate just one example of how a tragic accident could incur. FIG. 1(a) is a front view which illustrates two technicians wheeling a heavy cart of items to be sterilized into an autoclave. FIGS. 1(b) and 1(c) are front and sectional side views, respectively, showing the cart after it has been moved into the autoclave and after the male technician has received a cell phone call and the female technician has slipped and become trapped between the rear wall or the rear door of the autoclave and the heavy cart. FIG. 1(d) shows the distracted male technician on his cell phone while a third "helpful" technician closes the front door of the autoclave. FIG. 1(e) shows the male technician starting the cleaning cycle of the autoclave, unaware that his female co-worker is trapped inside.

SUMMARY

Safety systems having a visible light emitter, a first signal light transmitter, a first signal light receiver, preferably a second signal light transmitter and second signal light receiver, a fiber optic bundle with at least one section of illuminated cable which emits visible light and which also comprises optical cables which carry at least one and preferably a plurality of different control signals. The signal light(s) follow an optical circuit through the fiber optic bundle from the signal light transmitter(s) to the signal light receiver(s). The signal light can be modulated and/or reflected back through the same length of fiber optic cable or can travel in a continuous path without reflection. If the signal light receivers receive the correct predetermined signal light, they generate electrical pulses. The signal light receiver(s) are connected to suitable controls, e.g. a safety control system having electrical pulse generators, pulse counters and safety relays which control the supply of utilities to the operating equipment. Under normal operating conditions, the safety control system provides a POSITIVE signal to allow the operating equipment to operate. But if the correct light signal is not received by the signal light receiver(s) or if the proper sequence of electrical pulses is not received by the electrical pulse counter, the operating equipment will be stopped, put into a safe mode, and/or alarms will be generated. The fiber optic bundle is connected to optical pull switches which interrupt the light circuit if a person applies a predetermined pull force to the optical fiber bundle. The illuminated cable is designed to be visible to a trapped person in a dark environment.

DETAILED DESCRIPTION

Figure 1A:
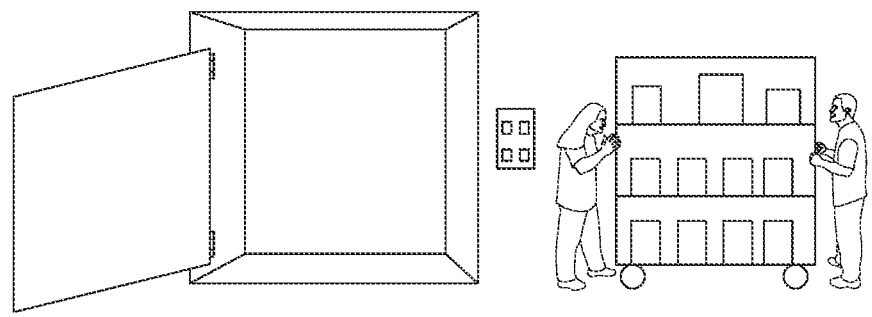
FIGS. 1(a)-1(e) illustrate a possible scenario of a tragic accident involving an autoclave of the prior art.
Figure 1B:
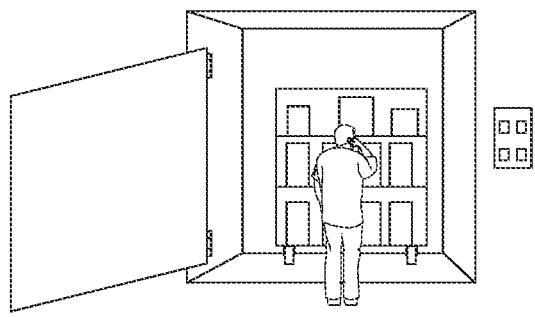

The various embodiments are Illuminated Safety Pull Switch Systems (ISPSS). The illustrated safety systems are depicted in connection with one-door and two-door autoclaves, as well as a motorized conveyor belt, but are also particularly useful in grain silos, explosive environments such as oxygen storage tanks, other confined spaces which typically involve human ingress/egress, and other dangerous operating environments.

Illuminated pull cables are connected to optical pull switches mounted inside the equipment's chamber, with the controls mounted outside the chamber. The safety systems preferably work independently of the controls and programs of the operating equipment, e.g. the autoclave controls, and de-energize the operating equipment by disrupting the power supply to the equipment, thus stopping the machine. For example, in one preferred embodiment, normally open contacts of the safety system's relay form a circuit to the supply valve or utility input contactor, when the safety system is in ready mode, enabling the utilities to be provided to the machine. When the safety system's photo electric signal is interrupted or when there is no electrical power, the safety system's relay is de-energized, changing the relay's contact from normally open to normally closed, breaking the circuit to the supply valve and/or utility input contactor, thus de-energizing/interrupting all dangerous utility sources to the operating equipment.

The utility supply valve or utility input contactor is either separate from and/or additional to the supply valve or utility input contactors which supply or enable steam and electricity to flow to the operating equipment, e.g. autoclave. In other words, the flow of electricity and, in the case of an autoclave, steam can be interrupted at the operating equipment's pre-existing valve or upstream of the operating equipment with an added valve at the source of the supply of electricity, steam, compressed gas, etc.

The safety systems utilize a positive feedback photo circuit passing through optical fibers in which signal light and visible light is transmitted. In the illustrated embodiments in which the operating equipment includes a dangerous confined space, the fiber optic photo circuit starts outside the confined space of operating equipment, runs into the confined space of the operating equipment, through the safety pull-switch mechanisms and back out of the confined space to signal light receiver(s) to complete the circuit. The visible light passes through side emitting optical light guides, e.g. fiber optic bundles, and is visible within the confined space. A person trapped in the confined space can pull the visible light guide and break the photo circuit. A broken photo circuit results in the disruption of the hazardous energy sources supplying the operating equipment, thus stopping the operating equipment.

The illustrated safety systems utilize light passing through optical fibers. The optical circuit starts at an optical control box where visible light and signal light is emitted by photo emitters and is "injected" into an optical fiber bundle at a location outside the enclosed chamber. The optical fibers extend from the photo emitter, into the inside the confined space of the equipment, through at least one pull switch mechanism and back out of the equipment's chamber to an optic-electric receiver, to form a light (photo) circuit. As described with reference to various embodiments below, the emitted light can pass continuously through a continuous light circuit via optical fiber or optical cable, the "outgoing" the light can be reflected back so that the "returning" light passes through the same optical fiber as the "outgoing" light, or the "outgoing" light can be altered with a modulator unit and reflected back through the same light carrier to the optic-electric receiver. In each case, the optic-electric receiver detects the incoming light and determines whether the "returning" light has the proper light wave properties. Preferred embodiments utilize a plurality of different signal lights which are received by different signal light receivers for enhanced safety and system integrity. Preferred embodiments also conduct each signal light through a dedicated fiber optic cable or bundle which is different from the cable or bundle which conducts the visible light.

If the "returning" light reaches the optic-electric receiver with the proper light wave properties, the receiver then transmits an electrical signal to the safety control system which includes a safety relay for processing. For example, one example of a suitable safety relay is model ESM-BA201 available from Euchner-USA, Inc. of East Syracuse, N.Y., USA. The positively processed returning light signal enables the activation or continued supply of energizing utility sources to the operating equipment.

When the signal light circuit is broken or modified by a person pulling on the illuminated optical fiber inside the confined space resulting in the activation of the optical pull switch, or by physically breaking the signal optical fiber, the opto-electric receiver no longer receives the anticipated light signal and stops transmitting a POSITIVE electrical signal to the safety control system. When a plurality of different signal lights are utilized, if any one of the signal light receivers no longer receives the correct, anticipated light signal, the safety control system stops transmitting an electrical signal which indicates a positive condition. Since the electrical signal normally indicates a safe or positive condition, i.e. the absence of an activated fiber optic pull switch, it is referred to herein as a "POSITIVE" signal. Thus, the disruption or absence of a POSITIVE electrical signal to the safety relay trips the safety relay into the "trip mode" and stops the operating equipment, e.g. by de-energizing the dry contacts that enable the utility sources. If the equipment's controls have safety controls and or circuits, the system will alternatively or additionally provide the change in condition status to those controls.

As part of a preferred safety system's fail-safe strategy, one of the utilities disrupted is the control voltage to the operating equipment. A preferred safety directive requires the physical resetting of the optical pull switches and the subsequent resetting of the safety control system's safety circuits. In other words, in preferred embodiments, the control voltage can only be reset after the safety control system's controls have been reset. This is designed to prevent an unauthorized override of the safety features by technicians who are using the operating equipment. The resetting of the safety circuits is preferably performed in steps to prevent the inadvertent, unintended activation of the utilities powering the operating equipment. If the access doors or hatches to the enclosed space can be unlocked via electrical signals, the system will also optionally enable the unlocking of the doors and/or hatches to the confined space.

Figure 2:
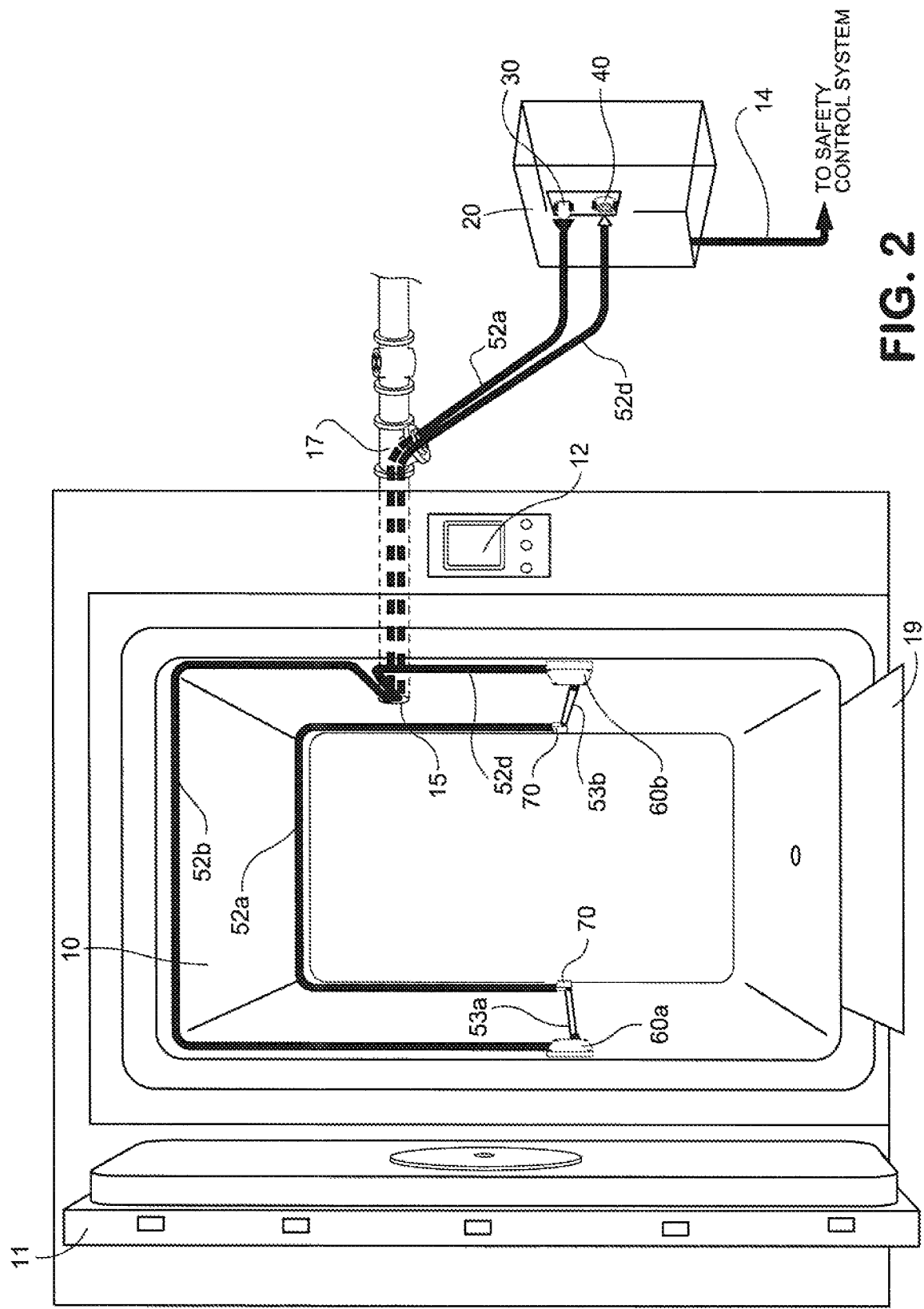
FIG. 2 illustrates a single door autoclave with a first fiber optic safety system.
Figure 3:
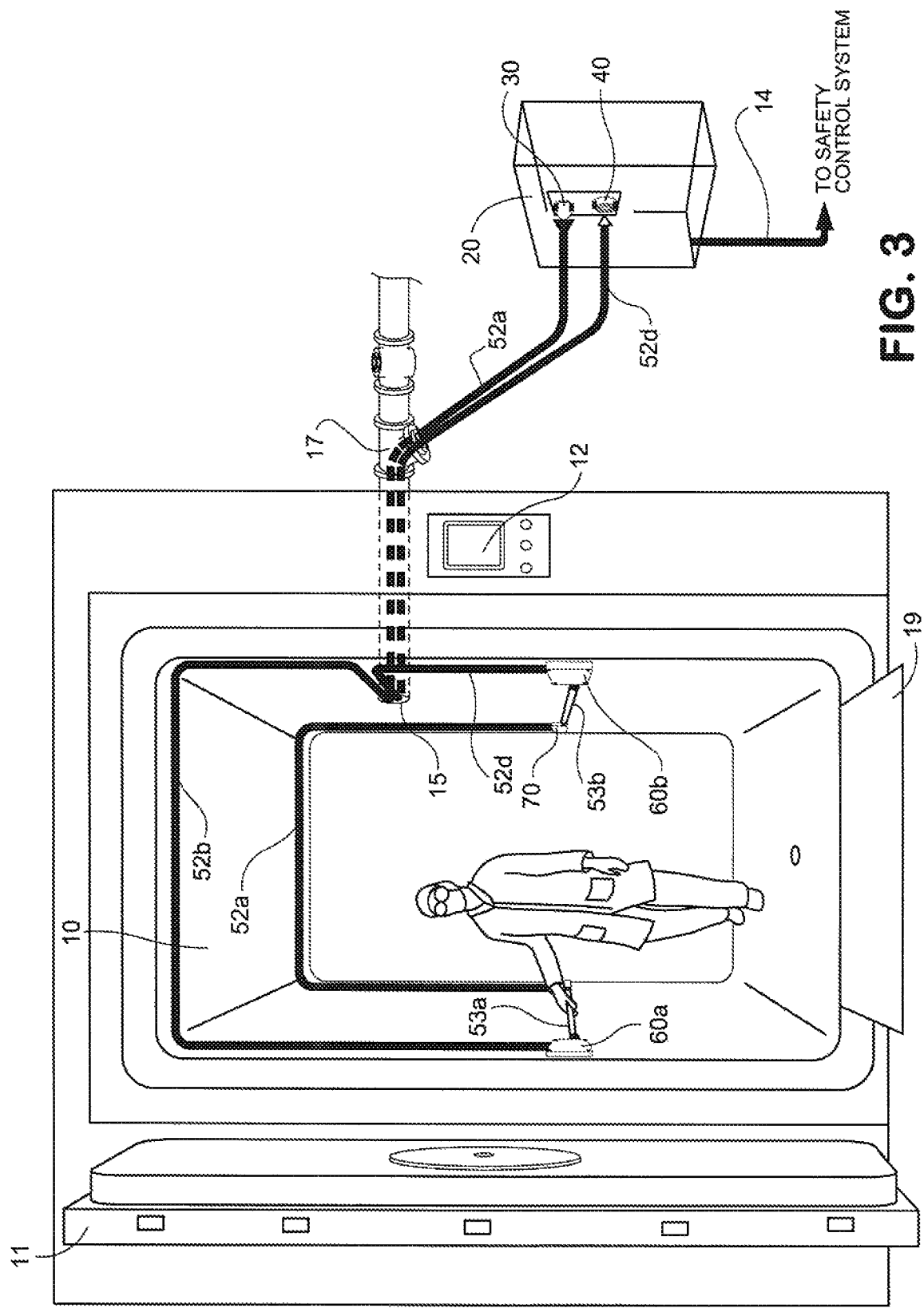
FIG. 3 is the system shown in FIG. 2 with a person standing inside the autoclave.

With reference to the figures, FIGS. 2 and 3 illustrate equipment, which in this illustrated embodiment is a single door autoclave, having a confined space 10, a forward door 11, a control panel 12, a steam input/output port 15, and a first fiber optic safety system. A movable ramp 19 may be used with door 11 is open to facilitate wheeling a cart into confined space 10. The fiber optic safety system of this embodiment comprises a control box 20 which houses a photo emitter 30 and a photo receiver 40. A fiber optic bundle 50 carries visible light as well as light signals which are detected by photo receiver 40 at the control box 20. The fiber optic bundle 50 has sections 52 which are clad or opaque in order to internally reflect both the visible and the signal light. The fiber optic bundle 50 also has illuminated activation sections 53 which are provided with a clear, translucent or colored sheathing, e.g. red, which emit visible light along activation section 53 and is therefore visible to a person in the confined space 10. The activation sections 53*a*, 53*b* are connected to fiber optic pull switches 60. This illustrated embodiment has two fiber optic pull switches 60*a* and 60*b*. A person caught in a confined space can pull on an illuminated activation section 53 of the fiber optic bundle to activate fiber optic pull switch 60 which causes a discontinuity in the signal light circuit, which through suitable controls results in stopping the hazardous aspects of the equipment from operating, activation of an alarm and/or the unlocking the confined space doors.

In the embodiment shown in FIGS. 2 and 3, visible light and signal light are sent from photo emitter 30 through separate light guides (not shown) in fiber optic bundle section 52*a* which passes through an isolation fitting 17 and through steam port 15 into confined space 10. The light path continues through fiber optic bundle section 52*b* upwardly and across the top front section of the confined space 10 to fiber optic pull switch 60*a*. Provided that the system is in the "ready" mode, the light path continues rearwardly in the confined space 10 along the left wall of the confined space through fiber optic activation section 53*a* to a fiber optic anchoring coupling 70. The light circuit continues through anchoring coupling 70, up the left wall, over the ceiling of the confined space 10 and down to another fiber optic anchoring coupling 70 located on the right wall of the confined space 10. The light path continues forwardly along the right wall of the confined space 10 through illuminated fiber optic activation section 53*b* to fiber optic pull switch 60*b* which is connected to the right wall of the confined space 10. The light path exits the top of fiber optic pull switch 60*b* and continues upwardly and rearwardly to steam port 15 through fiber optic bundle section 52*d* where it exits the confined space 10 and travels to photo receiver 40. The safety systems described herein which have light moving along a path without intentional internal reflection are referred to as having a "through-beam configuration".

The fiber optic activation section 53*a* and 53*b* in this embodiment emit a visible light designed to maximize visibility in the harsh environment of the particular confined space. For example, in one embodiment the intensity of the light, emitting from the side of the side emitting fiber optic activation section 53 conforms to USCG and EC Marine Navigational Lights Directive: 2009/26/EC—Item A.1/6.1, of 4.3 candelas with a visibility of 2 nautical miles (3.7 km) as tested pursuant to UL 1104. In an alternative embodiment the source of visible light emits visible light such that at least one of the illuminated sections emits visible light of at least 3 candelas, preferably at least 4 candelas. The source of visible light can provide light at desired levels for the anticipated environment in the confined space or work area in the case of the embodiment illustrated in FIG. 14. A person trapped in the confined space can pull on any of the illuminated fiber optic activation sections 53 (53*a* or 53*b*) to stop the operating cycle of the autoclave, unlock the access door(s) and/or send alarms to initiate a rescue. Pulling an illuminated fiber optic activation section 53 activates the fiber optic pull switch 60 connected to that fiber optic activation section 53. The activation of the fiber optic pull switch 60 triggers the desired shut down or alarms. The structure and operation of two exemplary types of fiber optic pull switches are described below with reference to FIGS. 10-13. FIG. 3 illustrates a person standing inside the autoclave of FIG. 2.

The optical control box 20 of the fiber optic safety system is connected to a safety control system (described below) via cable 14. The safety control system controls whether utilities are provided to the operating equipment and is capable of stopping all or part of the operation of the operating equipment. As used herein, the term "utilities" includes electricity, steam, natural gas, a compressed gas, etc.

As used herein, the term "confined space" is used to indicate a volume of space which is large enough for an adult human, i.e. at least 600 mm wide×1400 mm high×1000 mm long, and which is substantially enclosed during at least one phase of the equipment's normal operation so that hazardous conditions associated with the normal operation of the equipment creates a serious health risk to the well-being of a person in the confined space.

Figure 4:
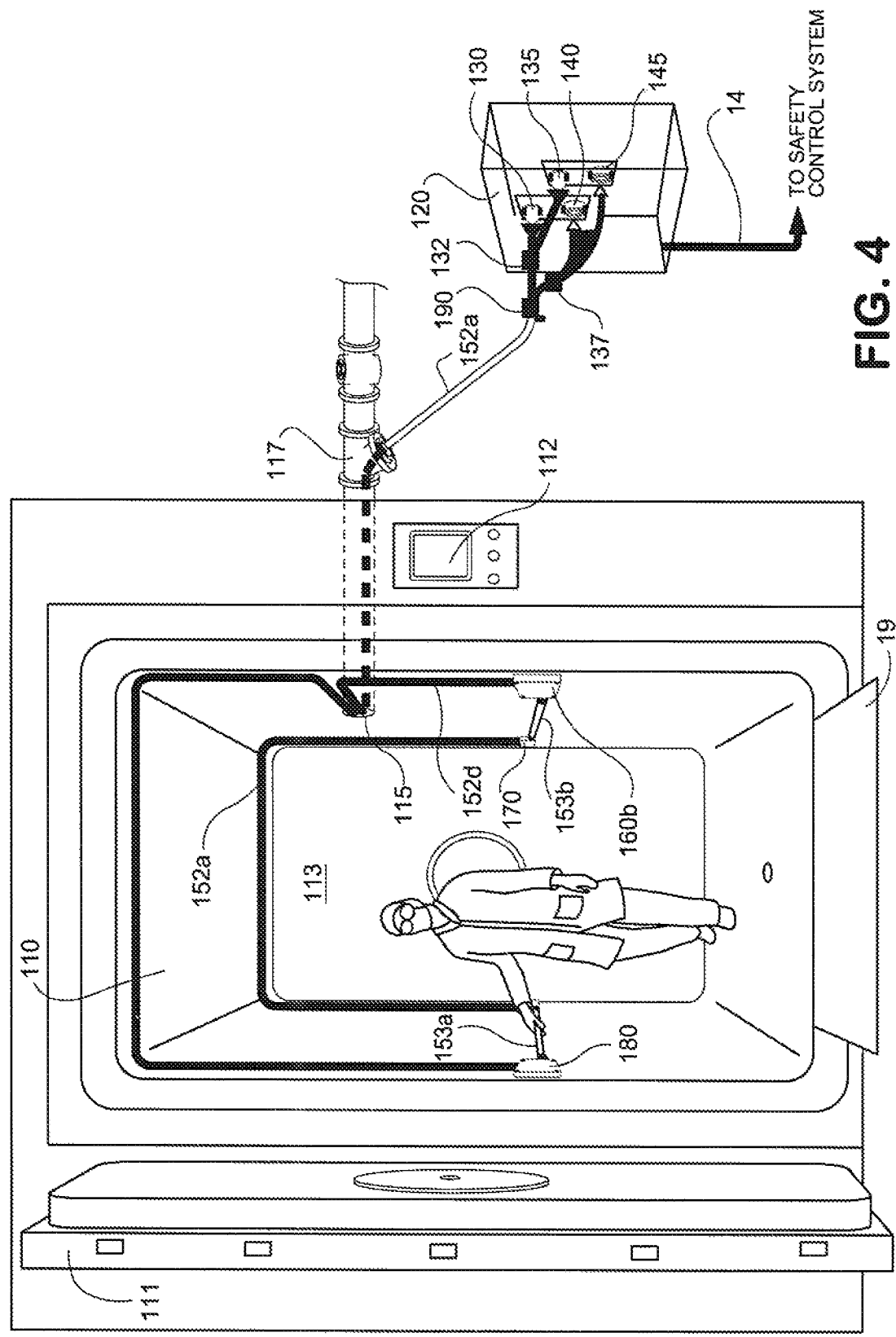
FIG. 4 illustrates a two-door door autoclave with a second fiber optic safety system.

FIG. 4 illustrates a two-door autoclave with a second fiber optic safety system. In other words, the autoclave shown in FIG. 4 has a forward access door 111 and a rear access door 113. The presence of a rear door 113 can improve convenience and facilitate smooth workflow through the autoclave, but may also increase the risk of a person being inadvertently trapped inside the confined space. The illustrated second fiber optic safety system has two separate signal light emitters 130, 135 and two corresponding and separate photo receivers of the signal light 140, 145. The use of two independent sources of signal light provides a higher level of safety by providing redundancy and a greater level of resilience. In this embodiment, light emitter 130 preferably emits light having different light characteristics than the light emitted from light emitter 135. For example, the light characteristics of the two lights can differ in terms of frequency, wavelength, amplitude, intensity, number of pulses and/or the duration of pulses. The use of light with different light characteristics is designed to avoid a false "safe" detection by one of the signal light photo receivers in the event that the safety system is tripped, i.e. activated or compromised, and light from the wrong source enters the return light path to an unintended photo receiver.

Additionally, the signal light in the embodiment of FIG. 4 is modulated and reflected back through the same fiber optic bundle 152, 153 by a reflective optic wave modulator 180. One or more reflective optic wave modulators 180 positioned at the far end of the light circuit in confined space 110 changes at least one characteristic of at least one of the emitted signal lights and returns the changed, i.e. modulated, light to the signal light receivers 140, 145 which are waiting to receive a light signal having the specific characteristics of the modulated light. For example, in one embodiment, the reflective optic wave modulator 180 comprises a material that fluoresces specific wave lengths when stimulated by ultraviolet light. The ultraviolet light is generated by UV light generators (photo emitters) 130 and 135 and the returned specific wave length light is received by the photoelectric receivers 140 and 145, respectively which are calibrated to respond to a predetermined specific wave length. If either one of the predetermined specific wave lengths of signal light are not received by the respective photoelectric receivers 140 and 145, the safety system is activated as this indicates an interruption in the signal light path. Lack of either predetermined signal light will register as a "fault" shutting down the system. As used herein, light received by a light signal receiver is considered to have "emanated" from the corresponding light signal source regardless of whether one or more characteristics of the original signal light have been modulated. In other words, a first signal light receiver is considered to have received a signal light "emanating" from a first signal light source even if that light signal has been modulated in some fashion before reaching the first signal light receiver. In any event, a signal light receiver does not provide a POSITIVE, i.e. safe, indication to a safety control system unless the "correct" predetermined signal light is received by that signal light receiver.

The use of a reflective optic wave modulator further enhances the safety and integrity of the safety system since the corresponding signal light receiver recognizes only the unique characteristic properties of the modulated light which differs from the emitted light source. If light from the signal light emitter 130 is reflected back to the signal light receiver 140 prior to passing through the full light circuit, the photoelectric receiver 140 will not recognize the light from emitter 130 since photoelectric receiver 140 is only responsive to the specific modulated light returning from the reflective optic wave modulator 180. Similarly, light originating from emitter 135 will not be recognized by photoelectric receiver 140 even after passing through the reflective optic wave modulator 180 since the characteristics properties of the modulated light from emitter 135 is not recognized by photoelectric receiver 140 since photoelectric receiver 140 is designed to only recognize light having the modulated light characteristics of light originating from emitter 130 which differ from those originating from emitter 135. The safety systems described herein which have light intentionally moving in both directions along the same length of fiber optic bundle due to a reflector or a reflective optical wave modulator are referred to as a "retro-reflective configuration". One example of a suitable light wave modulator is model no. OSP-A available from Opsens Solutions, Inc. of Quebec, Quebec, Canada.

Figure 1C:
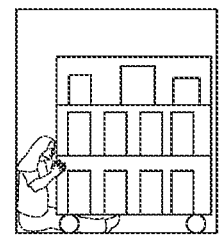
Figure 1D:
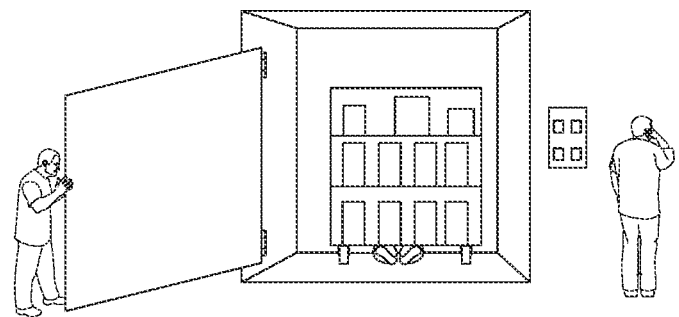
Figure 1E:
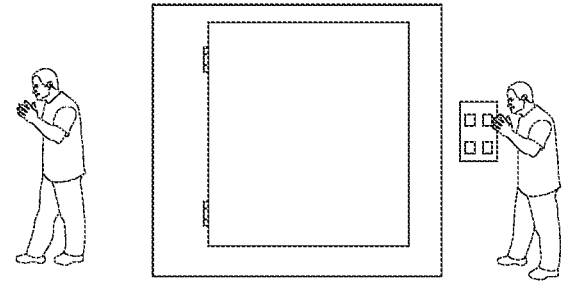
Figure 5:
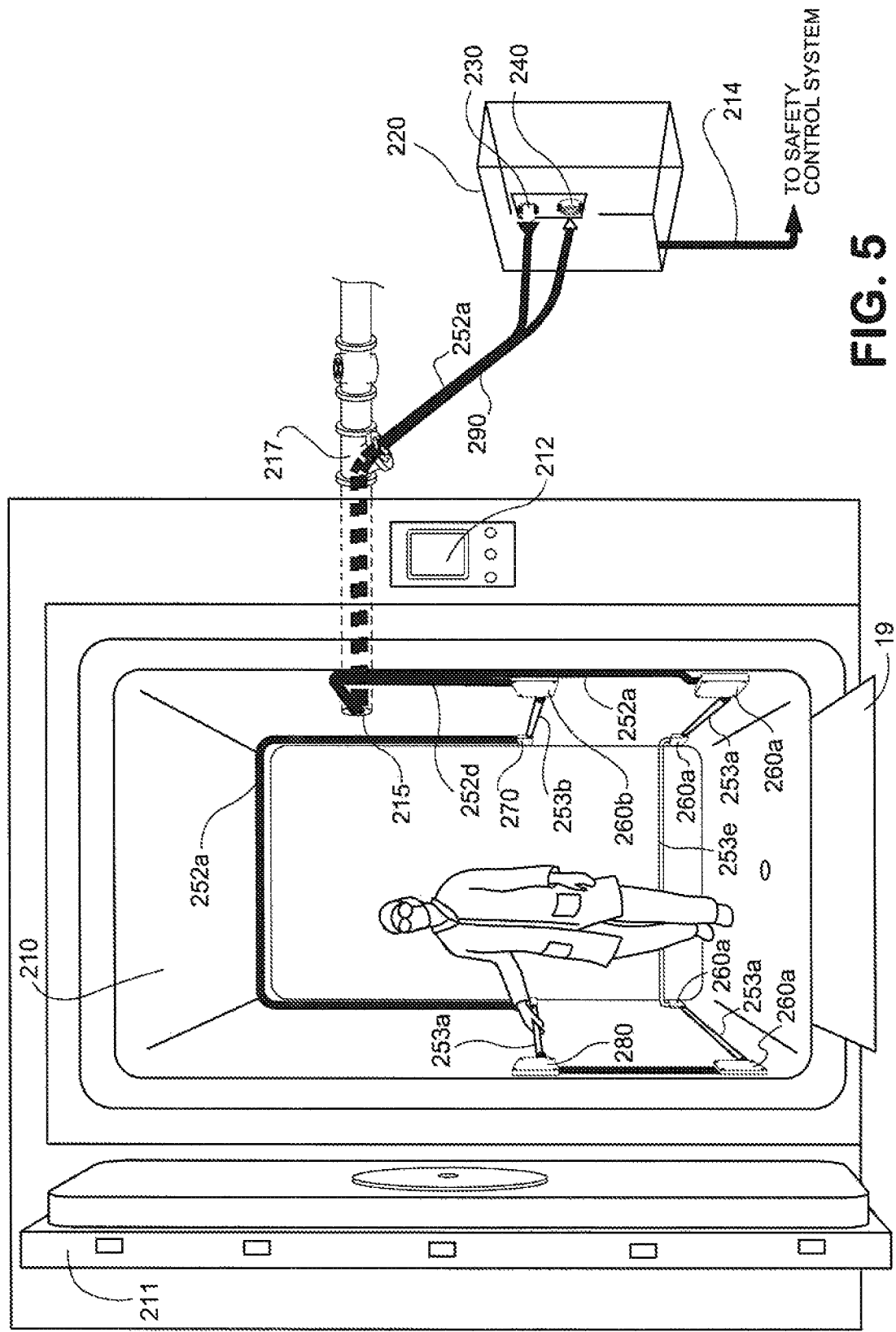
FIG. 5 illustrates a single door autoclave with a third fiber optic safety system.

FIG. 5 illustrates a single door autoclave with a third fiber optic safety system comprising two illuminated fiber optic activation sections 253 (253a, 253b, 253c, 253d) at each of two different height levels within the confined space. A person trapped in a confined space may have very limited visibility, very little time to activate the safety system and very limited room for movement. For example, the woman shown in FIG. 1(c) might not be able to see or reach an illuminated fiber optic activation cable at waist height if the autoclave has filled up with steam. The provision of lower illuminated fiber optic activation cables 253c and 253d in the embodiment of FIG. 5 increases the likelihood that a trapped person could find and activate the safety system. Activation cables 253 can be provided at more than two different height levels if desired, e.g at three levels, four levels, etc., depending on the risks posed by the specific operating equipment. While the illuminated fiber optic activation cables are illustrated as extending horizontally in the figures, they can extend vertically and/or in other orientations as desired. The embodiment shown in FIG. 5 is similar to the embodiment shown in FIGS. 2 and 3 in other respects.

Figure 6:
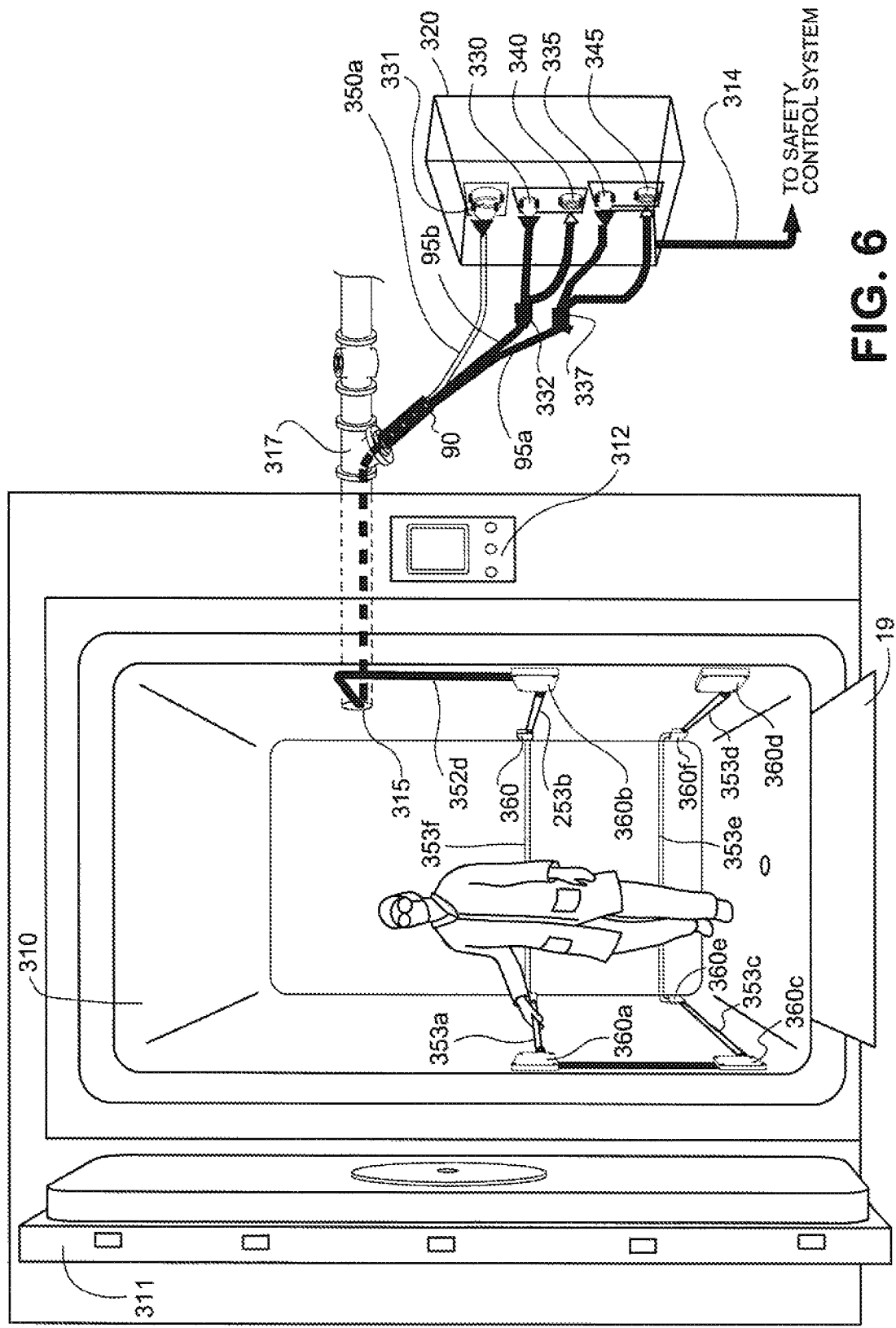
FIG. 6 illustrates a single door autoclave with a fourth fiber optic safety system.

FIG. 6 illustrates a single door autoclave with a fourth fiber optic safety system having a first signal light emitter 330, a second signal light emitter 335, corresponding light receivers 340, 345, respectively, and a separate visible light emitter 331. Light emitted from emitter 330 passes through an optical coupling 332 in the outgoing direction and back through optical coupling 332 in the returning direction. An optical coupling 337 is provided for the emitter 340 and receiver 345. The optical coupling is designed to pass the light having the desired characteristics in the desired direction. One example of a suitable optical coupling is model no. SFT-S35-01xN available from Opticon Inc. of Renton, Wash., USA. After passing through optical connectors, the light then passes into the bundle assembly 90 described in greater detail with reference to FIGS. 8 and 9.

As in the embodiment described with reference to FIG. 5, the embodiment shown in FIG. 6 comprises illuminated fiber optic activation cables positioned at different heights in the confined space. In the embodiment of FIG. 6, the light does not pass continuously through the fiber optic bundle in the same direction but is reflected back by fiber optic pull switch 360c.

Figure 7:
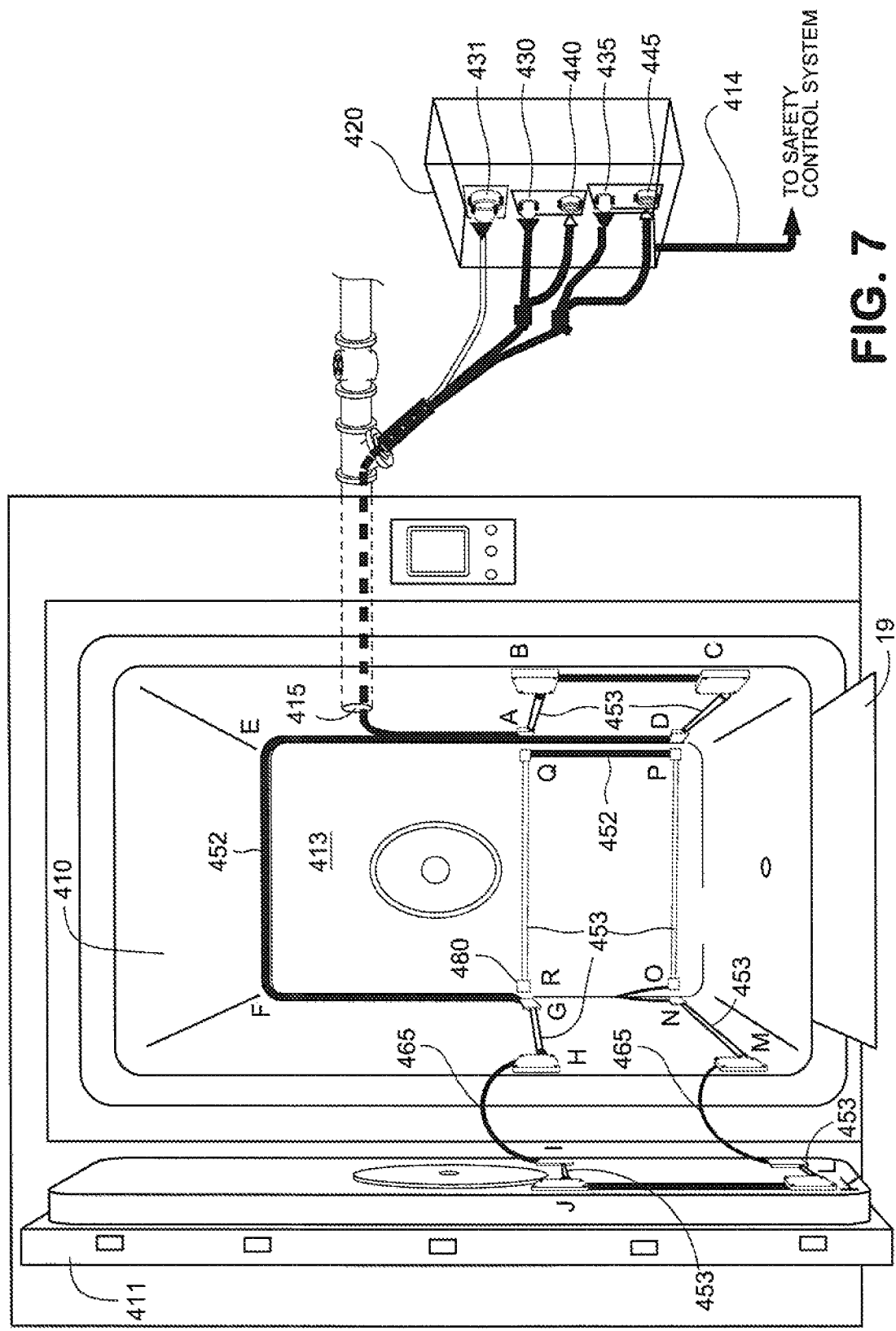
FIG. 7 illustrates a two-door autoclave with a fifth fiber optic safety system.

FIG. 7 illustrates a two-door autoclave with a fifth fiber optic safety system. Similar to the embodiment shown in FIG. 6, the embodiment shown in FIG. 7 has two independent signal emitters 430, 435 with corresponding photo receivers 440, 445, respectively, and a separate visible light emitter 431. In addition, the embodiment shown in FIG. 7 provides illuminated fiber optic activation cables 453e and 453f on the forward door 411 and illuminated fiber optic activation cables 453g and 453h on the rear door 413. Flexible fiber optic cables 465 connect the fiber optic pull switches 460 on the sidewalls with fiber optic pull switches 460 on each of the doors.

Additionally, in the embodiment shown in FIG. 7, the light from the two photo emitters 430, 435 is modulated and reflected back at anchor/modulator 480. After passing into confined space 410 through steam access port 415, the light path in this embodiment passes through optical bundles, illuminated activation sections 453, anchors and pull switch boxes in the direction which is indicated alphabetically by points A through R. At terminus R, the light is modulated and reflected back by anchor/modulator 480.

Figure 8:
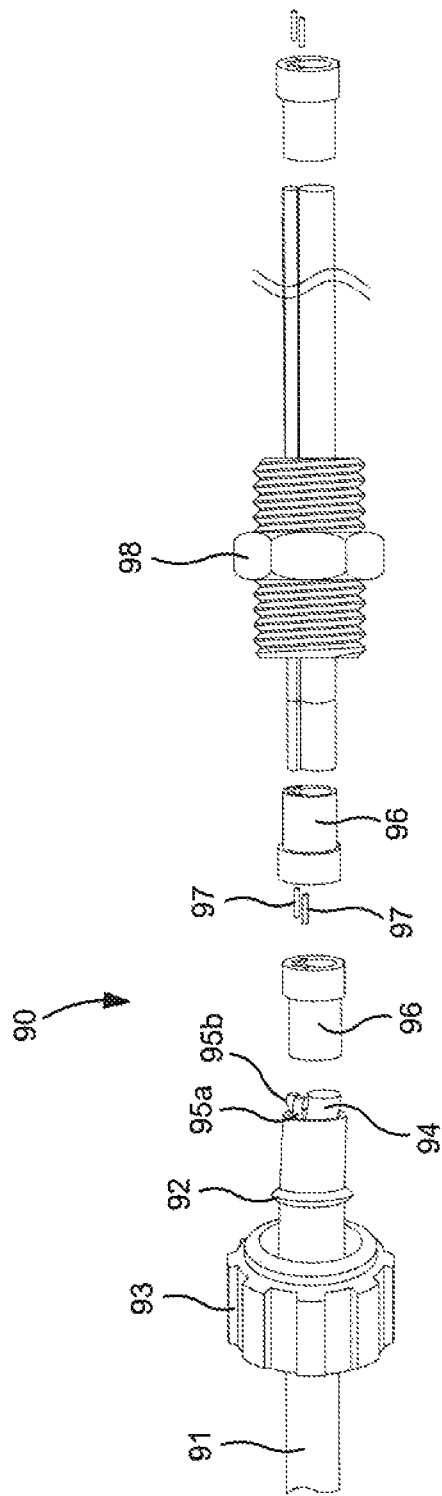
FIG. 8 is an exploded view of a fiber optic cable and end fitting which can be used with the safety systems shown in FIGS. 1-7.
Figure 9:
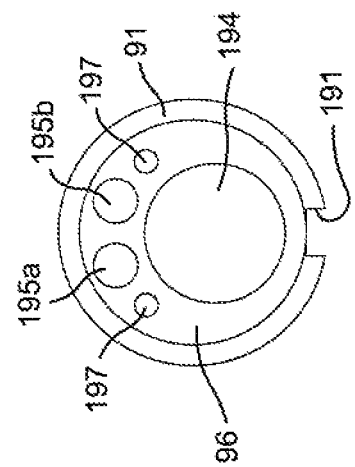
FIG. 9 is an end view of the inner portion of the end fitting shown in FIG. 8.

FIGS. 8 and 9 illustrate an exemplary fitting for connecting lengths of fiber optic bundles used in the safety systems. The illustrated fitting 90 comprises a tubing 91 having a gripper/compression ring 92, compression nut 93, visible light wave guide 94, signal light wave guides 95a and 95b, right and left end fittings 96, alignment pins 97 and male adapter 98.

FIG. 9 is an end view of the tubing 91 and a fitting 96 showing alignment pin bores 197, visible light bore 194 and signal light bores 195a and 195b. The tubing 91 shown in FIG. 9 has a gap 191 for allowing visible light to be emitted beyond the tubing 91. Tubing 91 can also be black and/or opaque along portions of the fiber optic bundle where it is not desired to see visible light, and translucent or a colored translucent, such as red translucent along portions of the fiber optic bundle where the escape of visible light is desired, i.e. along the activation sections.

Figure 10:
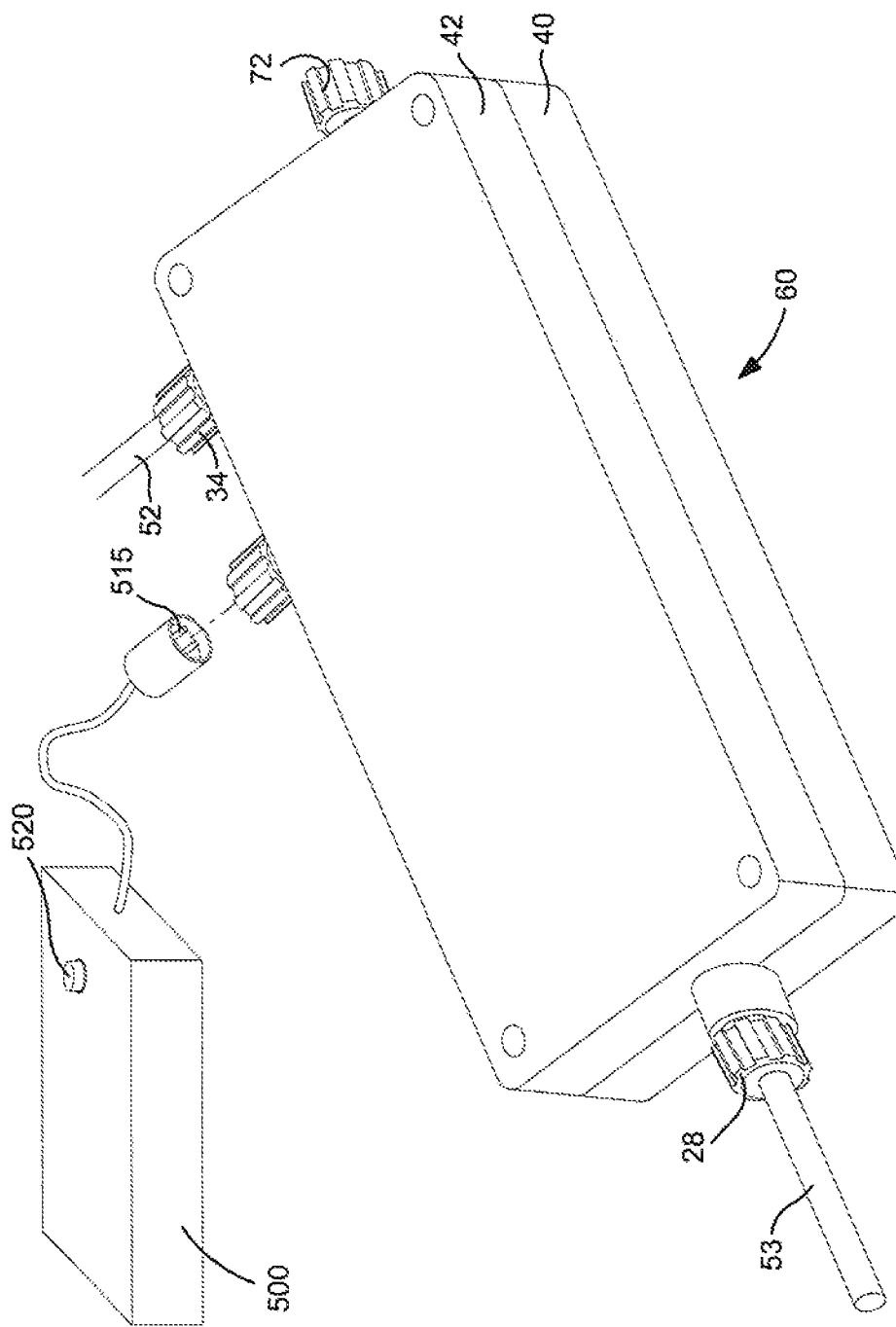
FIG. 10 is perspective view of one fiber optic pull switch.
Figure 11:
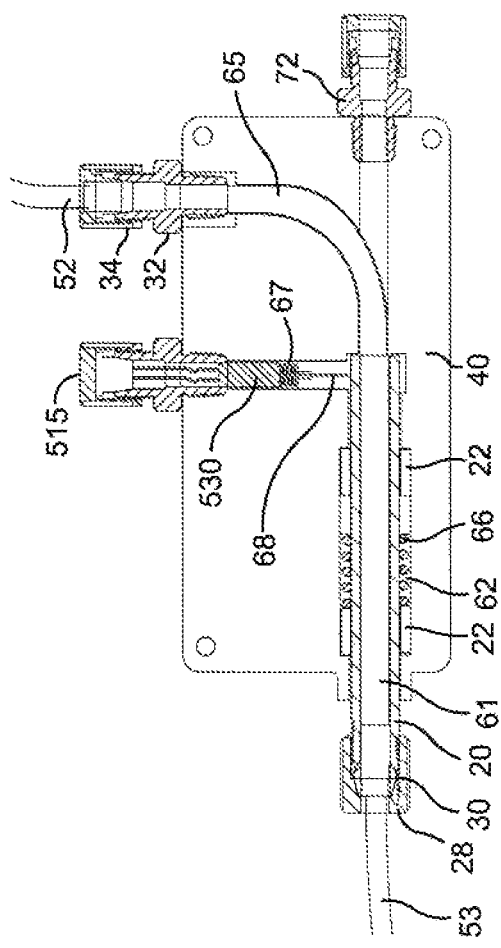
FIGS. 11 and 12 are cross-sectional views showing the ready and activated modes, respectively, of the fiber optic pull switch shown in FIG. 10.
Figure 12:
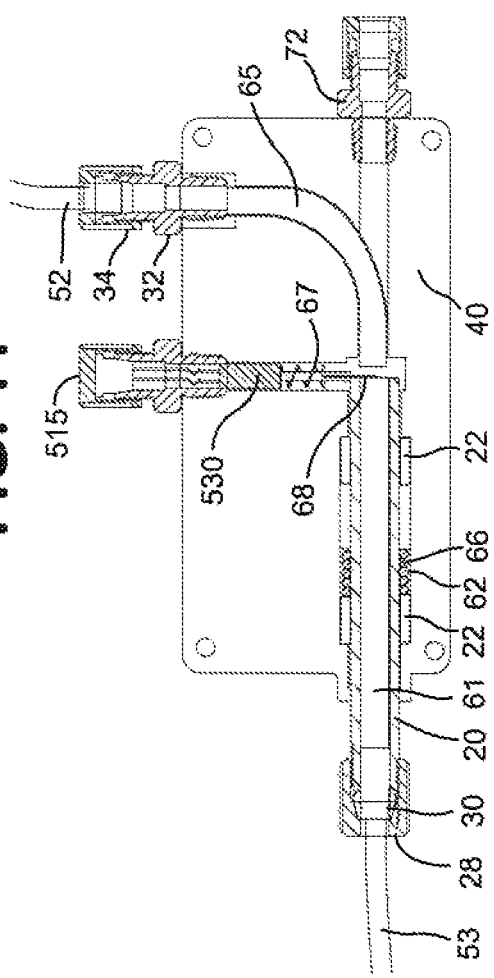

FIGS. 10-12 illustrate one embodiment of a fiber optic pull switch 60 with incoming activation fiber optic bundle 53 and outgoing fiber optic bundle 52, as well as a reset box 500 used to reset an activated pull switch 60. The pull switch 60 employs a movable shaft 61 having an optically transmitting core and a curved internal optical wave guide 65. Fiber optic bundle 53 is connected to the movable shaft 61 by a compression fitting 28 and a ferrule 30 while fiber optic bundle 52 is connected to optical wave guide 65 by a compression fitting 34 and ferrule 32. The movable shaft 61 has a tensioning spring 62 which, in cooperation with a retaining ring/shaft collar 66, holds the shaft 61 in place against the internal optical wave guide 65 when the switch 60 is in the "ready" mode shown in FIG. 11. Activation fiber optic bundle 53 is movable away from the internal optical wave guide 65 against the force of tensioning spring 62 when an activating force is applied to activation fiber optic bundle 53. The force needed to move shaft 61 can be set to any desired force. For example, a force of 20 to 200 newtons applied to activation cable 53 can be suitable for moving the shaft 61 and activating optical pull switch 60. Thus, the internal wave guide 65 is normally in abutting contact with movable shaft 61 and transmits light to the out bound fiber optic cable 52, which itself is held in place on the assembled housing 63 and abutting the internal optical wave guide 65.

Activation of the activation fiber optic bundle interrupts the light circuit. According the embodiment shown in FIGS. 10-13, a spring 67 applies force to an opaque shutter 68 which is normally held in the "Ready" position on the side of the movable shaft 61. FIG. 11 shows spring 67 and spring loaded shutter 68 in the "Ready" position. When the activation fiber optic cable 53 which is attached to the shaft 61 is pulled with sufficient force to overcome the tension on the shaft spring 66, the shutter 68 is forced in between the shaft 61 and the internal wave guide 65 by the shutter spring 67, thus interrupting the light circuit. FIG. 12 shows spring 67 and spring loaded shutter 68 in the "Activated" position where the light circuit has been interrupted. Shutter 68 can be opaque or partially opaque as long as it causes a detectable change in a light characteristic of at least one of the signal lights.

After being activated, fiber optic pull switch 60 preferably requires resetting by authorized personnel who are different from the people normally operating the equipment. FIG. 10 illustrates a reset box 500 which houses a battery pack (not shown). Reset box 500 is placed into electrical communication with fiber optic pull switch 60 via plug 510 which is inserted into a capped receptacle 515 in fiber optic pull switch 60. Activation of power button 520 on reset box 500 energizes a solenoid 530 in fiber optic pull switch 60 which withdraws shutter 68 from between the shaft 61 and the internal wave guide 65 to reset the shutter 68 from the "Activated" position shown in FIG. 12 to the "Ready" position shown in FIG. 11.

Figure 13:
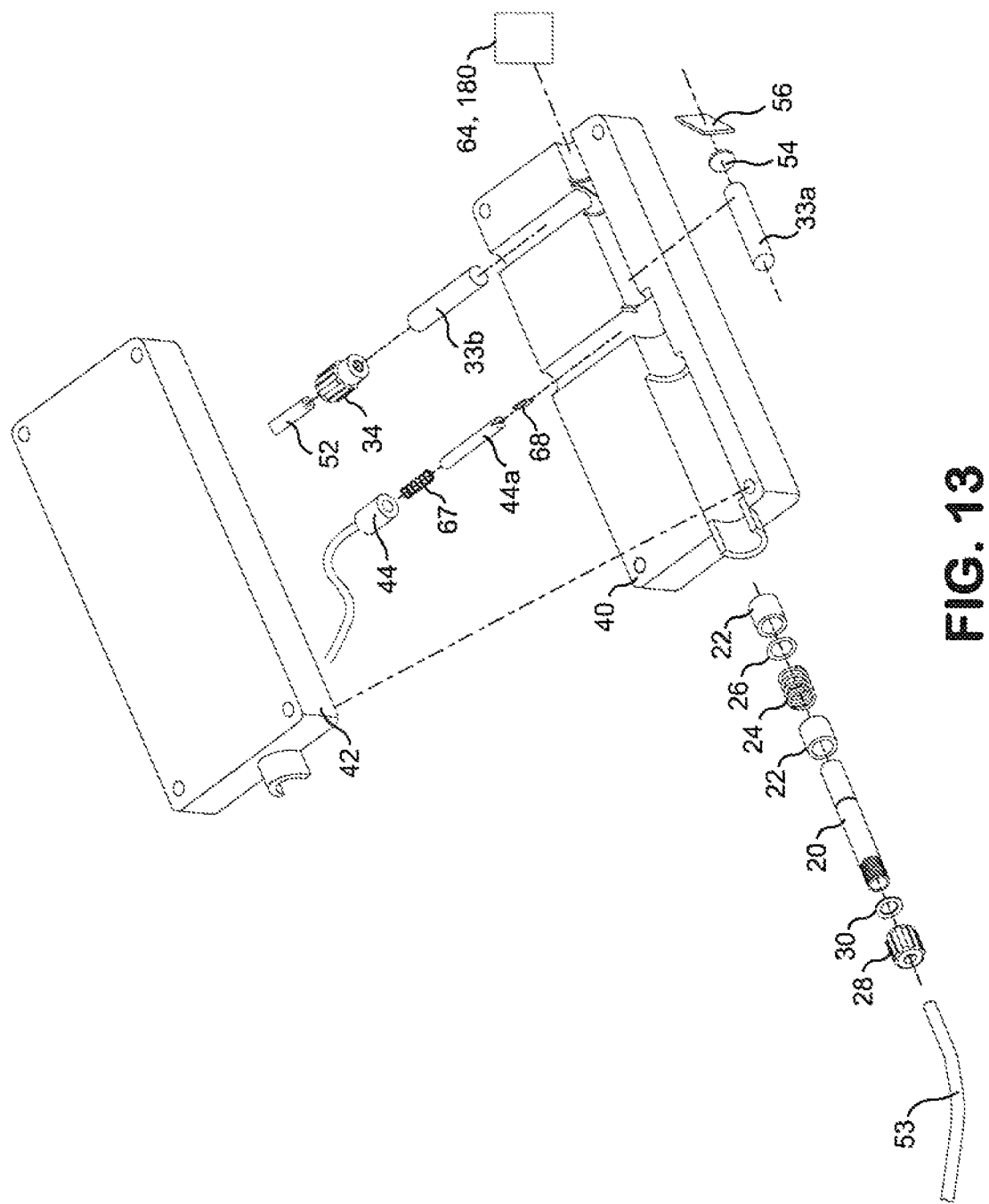
FIG. 13 is an exploded, perspective view of a second fiber optic pull switch.

FIG. 13 is an exploded, perspective view of another embodiment of a pull switch which uses a mirror 56 to direct light from one segment 33a of a light guide to another segment 33b of a light guide instead of a curved light guide 65 to direct light outwardly at an angle which is different from that of the incoming light. Absent mirror 56, the light continues to the reflective optic wave mirrored terminus 64 or a reflective optic wave modulator 180 and not to outbound fiber optic cable 52.

Figure 14:
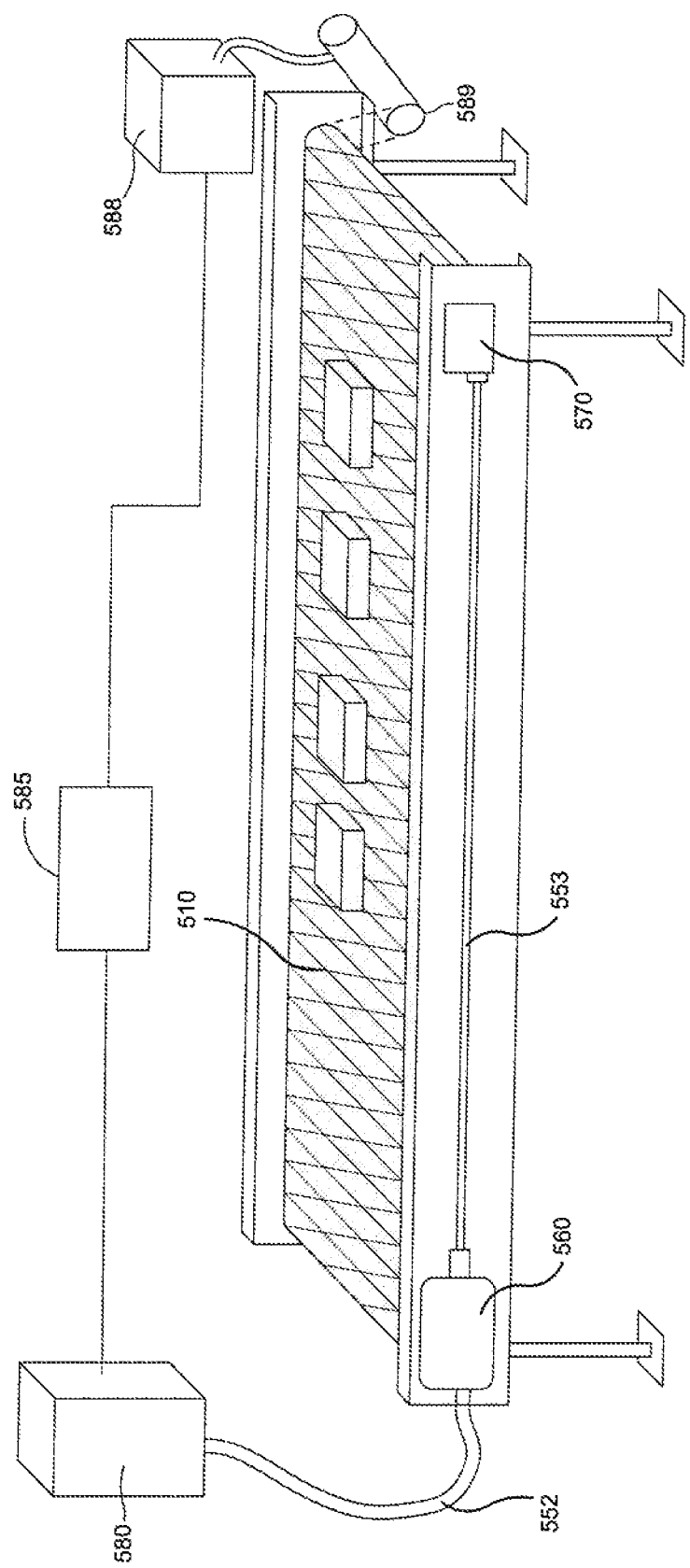
FIG. 14 illustrates a safety system mounted in proximity to a motorized conveyor belt.

While the illustrated embodiments show the disclosed safety systems used for confined spaces, they are also applicable to other work environments, perimeters of hazardous area, such as with robotic equipment, and in machine safe guarding. FIG. 14 illustrates a safety system mounted in proximity to a motorized conveyor belt 510. The safety system includes illuminated pull cable 553, optical pull switch 560, anchor 570, optical fiber 552, safety control system 580, a relay 585 connected to a drive motor power switch 588 of the conveyor belt drive motor 589. The safety control system 580 is capable of stopping all or part of the operation of the operating equipment and/or sending an alarm when the optical pull switch 560 is activated.

Figure 15:
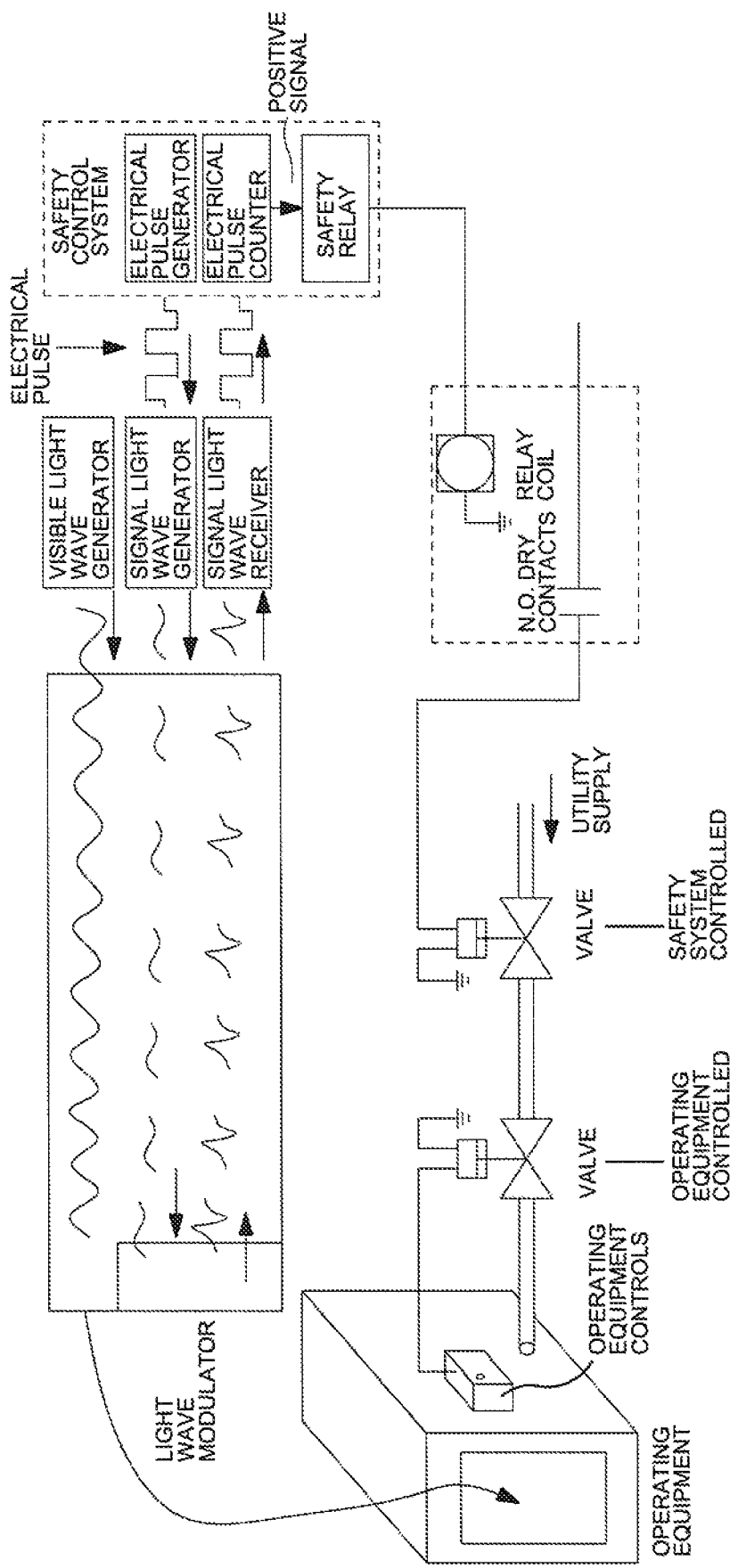
FIG. 15 is a block diagram illustrating one manner of connecting a safety system to existing operating equipment.

FIG. 15 is a block diagram which shows visible light and a pulsed signal light entering an optical wave guide. The signal light generator generates pulsed signal light in response to electrical pulses received from the electrical pulse generator. The pulsed signal light is modulated by a light wave modulator and the pulsed, modulated signal light is reflected back and received by a signal light wave receiver. If, and only if, a correct, predetermined light signal is received by the signal light wave receiver, i.e. correct in terms of all measured light characteristics such as wavelength, the signal light receiver will transmit corresponding electrical pulses to the electrical pulse counter. If, and only if, the electrical pulse counter receives the correct, predetermined sequence of electrical pulses, a POSITIVE signal is sent to a safety relay which allows the initial or continued activation of utility supply valves. The arrow from the illuminated fiber optic pull cable indicates a possible location of the illuminated fiber optic pull cable in the machine (dangerous operating equipment). On the other hand, if the signal light receiver does not receive light having the correct, predetermined characteristics, or if the sequence of electrical pulses received by the electrical pulse counter is not correct, a POSITIVE signal will not be transmitted to the safety relay and the operating equipment will be shut down or put into a safe mode of operation.

Figure 16:
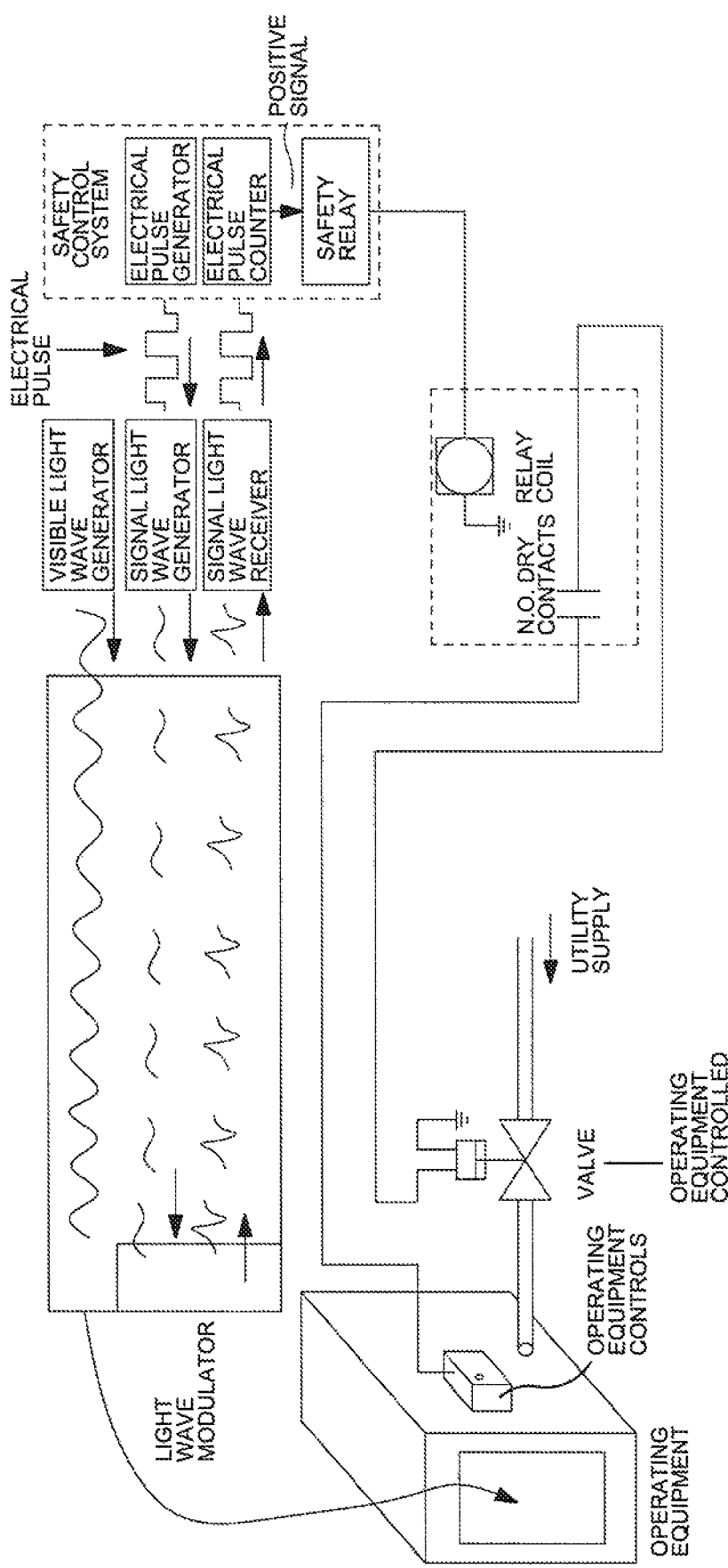
FIG. 16 is a block diagram illustrating another manner of connecting a safety system to existing operating equipment.

FIG. 15 shows the safety control system connected to a safety system control valve which cuts off the utility to the operating equipment. FIG. 16 shows an alternative arrangement where the safety control system is connected to a pre-existing valve of the operating system for shutting off the utility when a POSITIVE signal is not received by the safety relay. The disclosed safety systems can have any number of desired safety relays, such as one safety relay for each utility used by the operating equipment.

The optical wave guide, e.g. fiber optic bundles(s), can pass through many sealed environmental barriers e.g. into a harsh, hazardous or explosive environment, or other confined spaces through pre-existing or new access ports. The fiber optic bundle can relatively small, such having an outer diameter of about 3 mm-12 mm.

The invention claimed is:

1. Operating equipment comprising:
   a structure defining a confined space large enough to a contain a human adult;
   a supply of at least one utility to said structure;
   a supply controller which controls the amount of at least one utility supplied to said structure and changes the condition in said confined space from a first condition which is tolerable for an adult human to a second condition which presents an imminent danger to the survivability of a human adult;
   a safety system for said confined space, said safety system comprising:
   a fiber optic bundle;
   a visible light source which provides visible light, said visible light source optically connected to said fiber optic bundle;
   a first signal light source which emits a first signal light having first light characteristics, said first signal light source optically connected to said first optical bundle;
   a second signal light source which provides a second signal light having second light characteristics which are different from said first light characteristics, said second signal light source optically connected to said first optical bundle;
   said fiber optic bundle comprising at least one illuminated section within said confined space which emits said visible light;
   a fiber optic safety switch;
   said fiber optic bundle connected to said fiber optic safety switch and movable relative to a portion of said safety switch, said fiber optic safety switch activatable in response to movement of said fiber optic bundle relative to said fiber optic safety switch;
   a first signal light detector which is optically connected to said fiber optic bundle and receives signal light corresponding to light emanating from said first signal light source, said first signal light detector sends a signal to said controller only if said first signal light detector receives a signal light with first predetermined light characteristics;
   a second signal light detector which is optically connected to said fiber optic bundle and receives signal light corresponding to light emanating from said second signal light source, said second signal light detector sends a signal to said controller only if said second signal light detector receives a signal light with second predetermined light characteristics;

said fiber optic safety switch prevents light with said first predetermined light characteristics from reaching said first signal light detector and light with said second predetermined light characteristics from reaching said second signal light detector when said safety switch is activated.

2. Operating equipment according to claim 1 wherein said fiber optic bundle comprises a separate wave guide for said visible light and said signal lights.

3. Operating equipment according to claim 1 wherein said fiber optic bundle comprises a separate first wave guide for said first signal light, a separate second wave guide for said second signal light and a separate third wave guide for said visible light.

4. Operating equipment according to claim 1 wherein at least one of said signal lights is pulsed.

5. Operating equipment according to claim 1 wherein said fiber optic bundle comprises a plurality of spaced illuminated sections located in said confined space.

6. Operating equipment according to claim 1 wherein said fiber optic bundle comprises a plurality of spaced illuminated sections located at different heights in said confined space.

7. Operating equipment according to claim 1 wherein said confined space comprises a plurality of access doors and said fiber optic bundle comprises illuminated sections on each of said doors in said confined space.

8. Operating equipment according to claim 1 wherein said confined space comprises a plurality of access doors and said fiber optic bundle comprises illuminated sections on each of said doors in said confined space and at different heights in said confined space.

9. Operating equipment according to claim 1 wherein said fiber optic bundle comprises a plurality of illuminated sections in said confined space which are separated by non-illuminated sections.

10. Operating equipment according to claim 9 wherein said safety system comprises a plurality of optical light switches.

11. Operating equipment according to claim 1 wherein said safety system comprises a plurality of optical light switches.

12. Operating equipment according to claim 1 wherein said source of visible light provides light to said fiber optic bundle of at least 4.3 candelas.

13. Operating equipment according to claim 1 wherein at least one of said illuminated sections emits visible light of at least 4.0 candelas.

14. Operating equipment according to claim 1 wherein said fiber optic safety switch is connected to an illuminated section of said fiber optic bundle and at least one other section of said fiber optic bundle for normally transmitting signal light between said illuminated section and said other section of said fiber optic bundle;

said fiber optic safety switch comprising:
a switch housing;
a movable, spring-biased optical core which is movable relative to said switch housing, said optical core comprising a proximal end and a distal end, said optical core normally conducting signal light between said illuminated section and said other section of said optical bundle;
a spring loaded shutter disposed proximate said distal end of said optical core;
and
wherein movement of said illuminated section causes movement of said optical core relative to said switch housing and allows said spring-loaded shutter to block at least a significant amount of signal light from passing between said illuminated section and said other section of said fiber optic bundle.

15. A safety system for operating equipment, said operating equipment comprising at least one controller which controls at least one aspect of the operating equipment, comprising:
a fiber optic bundle;
a visible light source which provides visible light, said visible light source optically connected to said fiber optic bundle;
a first signal light source which emits a first signal light having first light characteristics, said first signal light source optically connected to said first optical bundle;
a second signal light source which provides a second signal light having second light characteristics which are different from said first light characteristics, said second signal light source optically connected to said first optical bundle;
said fiber optic bundle comprising at least one illuminated section which emits said visible light;
a fiber optic safety switch;
said fiber optic bundle movable connected to said fiber optic safety switch, said fiber optic safety switch activatable in response to movement of said fiber optic bundle relative to said fiber optic safety switch;
a first signal light detector which is optically connected to said fiber optic bundle and receives signal light corresponding to light emanating from said first signal light source, said first signal light detector sends a signal to said controller only if said first signal light detector receives a signal light with first predetermined light characteristics;
a second signal light detector which is optically connected to said fiber optic bundle and receives signal light corresponding to light emanating from said second signal light source, said second signal light detector sends a signal to said controller only if said second signal light detector receives a signal light with second predetermined light characteristics;
said safety switch prevents light with said first predetermined light characteristics from reaching said first signal light detector and light with said second predetermined light characteristics from reaching said second signal light detector when said safety switch is activated.

16. A safety system for operating equipment, said operating equipment comprising at least one controller which controls at least one aspect of the operating equipment, comprising:
a fiber optic bundle;
a visible light source which provides visible light, said visible light source optically connected to said fiber optic bundle;
a first signal light source which emits a first signal light having first light characteristics, said first signal light source optically connected to said first optical bundle;
said fiber optic bundle comprising at least one illuminated section which emits said visible light;
a fiber optic safety switch;

said fiber optic bundle movable connected to said fiber optic safety switch, said fiber optic safety switch activatable in response to movement of said fiber optic bundle relative to said fiber optic safety switch;

a first signal light detector which is optically connected to said fiber optic bundle and receives signal light corresponding to light emanating from said first signal light source, said first signal light detector sends a signal to said controller only if said first signal light detector receives a signal light with first predetermined light characteristics;

said safety switch prevents light with said first predetermined light characteristics from reaching said first signal light detector and light with said second predetermined light characteristics from reaching said second signal light detector when said safety switch is activated.

17. A fiber optic safety switch comprising:

a switch housing;

a movable, spring-biased optical core which is movable relative to said switch housing, said optical core comprising a proximal end and a distal end, said optical core adapted to normally conduct light between a first section of a fiber optic bundle and a second section of optical bundle;

a spring loaded shutter disposed proximate said distal end of said optical core;

and wherein movement of said optical core relative to said switch housing allows said spring-loaded shutter to block at least a significant amount of light from passing between said first section and said second section of fiber optic bundle.

* * * * *